United States Patent
Chang et al.

(10) Patent No.: US 7,321,268 B2
(45) Date of Patent: Jan. 22, 2008

(54) ULTRA WIDEBAND AND FAST HOPPING FREQUENCY SYNTHESIZER FOR MB-OFDM WIRELESS APPLICATION

(75) Inventors: Ronald Chang, Fremont, CA (US); Sheng Yen, Fremont, CA (US); Wei Gao, Fremont, CA (US)

(73) Assignee: VIA Technologies, Taipei (TW)

( * ) Notice: Subject to any disclaimer, the term of this patent is extended or adjusted under 35 U.S.C. 154(b) by 77 days.

(21) Appl. No.: 11/377,735

(22) Filed: Mar. 16, 2006

(65) Prior Publication Data

US 2007/0105518 A1 May 10, 2007

Related U.S. Application Data

(60) Provisional application No. 60/733,533, filed on Nov. 4, 2005.

(51) Int. Cl.
*H03B 21/01* (2006.01)
*H03B 21/02* (2006.01)
*H03L 7/16* (2006.01)
*H04B 1/26* (2006.01)

(52) U.S. Cl. ............... 331/37; 331/25; 331/38; 331/39; 455/313; 455/314

(58) Field of Classification Search ............... 331/1 A, 331/16, 18, 25, 30, 31, 37–39, 179; 455/313, 455/314
See application file for complete search history.

(56) References Cited

U.S. PATENT DOCUMENTS

2005/0282514 A1* 12/2005 Kang et al. ............... 455/313

* cited by examiner

*Primary Examiner*—David Mis
(74) *Attorney, Agent, or Firm*—Wang Law Firm, Inc.; Li K. Wang

(57) ABSTRACT

A frequency synthesizer with a single PLL and multiple SSB mixers is presented. The frequency synthesizer includes a single PLL outputting a reference signal that is fed to a plurality of dividers coupled in sequence. The outputs from the dividers are mixed by the SSB mixers to produce signals with different frequencies. These signals with different frequencies can be selected through use of multiple selectors.

22 Claims, 6 Drawing Sheets

ULTRA WIDEBAND AND FAST HOPPING FREQUENCY SYNTHESIZER FOR MB-OFDM WIRELESS APPLICATION

CROSS REFERENCE TO RELATED APPLICATION

This application claims the benefit of U.S. Provisional Application No. 60/733,533, Ultra Wideband And Fast Hopping Frequency Synthesizer For MB-OFDM Wireless Application, filed on Nov. 4, 2005, the specification of which is hereby incorporated in its entirety by reference.

BACKGROUND OF THE INVENTION

1. Field of Invention

The invention relates generally to wireless communication and more particularly to an ultra wideband frequency synthesizer.

2. Related Prior Arts

The Federal Communication Commission (FCC) has reallocated 7.5 GHz unlicensed spectrum for ultra-wideband devices (UWB). UWB is emerging as a solution for the IEEE 802.15.3a standard. The purpose of this standard is to provide the features of a low complexity, low-cost, low power consumption, and high data-rate wireless connectivity for personal-area networks (PANs). Because FCC has made up the 3.1 to 10.6 GHz spectrum available for UWB applications, several methods have been proposed to come true high-rate short-range communication systems. Multiband orthogonal frequency division multiplexing (MB-OFDM) is one of the proposals, which divides the allocated spectrum into quadrature phase shifted keying (QPSK) OFDM modulated sub-bands, each with a bandwidth of 528 MHz. A frequency-hopping scheme, in order to achieve efficient and robust communication, is applied to hop between carrier frequency bands. MB-OFDM defines a unique numbering system for all channels with spacing of 528 MHz. Based on this, five band groups are defined, consisting of four groups of three bands each and one group of two bands. Band group 1 (centered at 3432 MHz, 3960 MHz, and 4488 MHz) is used for Mode 1 devices (mandatory mode). The remaining band groups are reserved for future use, band group 2 of which contains 5016 MHz, 5544 MHz, and 6072 MHz. The MB-OFDM system switches frequency at the rate of the OFDM symbol. The frequency must settle within 9.5 ns. Conventional tunable phase-lock oscillators fail to provide such a fast switching due to their long settling time (>250 us). Alternatives are to generate carrier frequency by feeding output signals of phase locked loops (PLLs), which is also known as phase frequency detecting circuits, into single-sideband (SSB) mixer or selectors, or combination of both to form beat product for required channels. All of them have the same goals of fast switching on the order of nanoseconds and provides needed channels. It is indeed welcome to push cost and performance to the best at the same time if applicable.

Some attempts have been devised to provide high performance and low cost and they include:

(a) A 7-Band 3-8 GHz frequency synthesizer with 1 ns band-switching time in 0.18 um CMOS technology as illustrated in FIG. 1.

This frequency synthesizer generates clocks for 7 bands distributed from 3 to 8 GHz. As shown in FIG. 1, this architecture accommodates bands of Group A and Group C, which are defined in IEEE 802.15-03/267r5, with 2 PLLs, 102, 104, two selectors 106, 108, and one SSB mixer 110. Group PLL 102 generates the reference frequencies, 6864 MHz and 3432 MHz for Group A and C, whereas Band PLL 104 produces twofold the increment frequencies, 2112 MHz and 1056 MHz, for frequency additions and subtractions. The feature of this design is that an additional programmable tri-mode buffer, capable of providing DC and quadrature signals with opposite I/Q sequences, is placed in front of one of inputs of the SSB mixer 110 so that the number of SSB mixers used deduces.

(b) A 0.13 um CMOS UWB Transceiver as illustrated in FIG. 2.

In a frequency synthesizer as shown in FIG. 2, the three local oscillator (LO) frequencies necessary for Mode 1 are produced by three fixed-modulus phase-locked loops 202 without using SSB mixers. The central frequency of each PLL 202 corresponds to each channel in band group 1, 3432 MHz, 3960 MHz, and 4488 MHz. Because of removal of SSB mixers, three PLLs 202 are needed to fix each channel frequency.

(c) A SiGe BiCMOS 1 ns Fast Hopping Frequency Synthesizer for UWB Radio as illustrated in FIG. 3.

This proposed multi-tone generator utilizes two quadrature PLLs 302, 304 to provide two fixed frequencies of 3960 MHz and 528 MHz, as displayed in FIG. 3. in order to match the Band group 1 requirement, PLL8G 302 output is taken as Band 2. Band 1 and Band 3 will be generated along with additions and subtractions by a SSB mixer 306 with an output from PLL2G 304 modified by increment frequency of 528 MHz. The divide-by-2 circuit 308 after voltage controlled oscillators (VCO) 310 is used to generate I/Q quadrature signals.

However, each of these attempts has some shortcomings. For example:

(a) A 7-Band 3-8 GHz Frequency Synthesizer with 1 ns Band-Switching Time in 0.18 um CMOS Technology illustrated in FIG. 1.

The frequency synthesizer of FIG. 1 uses a minimum number of SSB mixers and selectors to demonstrate super fast switching at 1 ns between bands. The idea of two PLLs of Group PLL and Band PLL is nice to synthesize many channel bands with one more additional building block of Tri-Mode Buffer; however, a big area is consumed for inductor-capacitor VCO (LC-VCO) design in the PLLs 102, 104. Besides, an even worse case occurs when each VCO need to generate quadrature signals, which means that a double space for inductors would be required.

(b) A 0.13 um CMOS UWB Transceiver illustrated in FIG. 2.

Although this circuit design looks good based on its performance, one thing needs to be focused on is that it uses three parallel PLLs 202 to focus on each channel frequency in Band group 1. That means, in the future, 14 PLLs may needed to cover the whole frequency range of MB-OFDM UWB communication bands from 3.1 to 10.6 GHz, if no SSB mixers and selectors are used. Furthermore, though ring oscillators, which are one type of VCO, are candidates for PLLs due to sensitivity degradation of 0.2 dB in the transceiver simulation, it might still be a very difficult challenge to generate 10.296 GHz for the 14th band channel by a typical design of a ring oscillator based tone generator. The phase noise associated with this ring oscillator PLLs 202 would be seriously unwanted. An additional inevitable disadvantage aroused from such design is that PLLs 202 need to stay in operation all the time. The power dissipation will be another big issue. In addition, if LC-VCO architecture is adapted for PLLs 202 to achieve higher resonant frequency, a huge amount of active die area is required for such frequency synthesizer design.

(c) A SiGe BiCMOS 1 ns Fast Hopping Frequency Synthesizer for UWB Radio illustrated in FIG. 3.

This frequency synthesizer uses dual-loop architecture with single-side band mixing to achieve the fast hopping characteristic. According to this design, use of one SSB mixer and one selector can provide only three channels in Band group 1. If more bands need to be covered for frequency hopping, such architecture may have to be modified. The purpose of placing a divide-by-2 after the VCOs is to bring out quadrature signal output for SSB mixers. Accordingly, with VCO resonant frequency doubled to operate in coordination to avoid using quadrature VCO results in more die area. Employing two PLLs to construct a Band group 1 frequency synthesizer is good but still occupies much die area.

Therefore, it is to a frequency synthesizer design that involves less complexity and occupies less die area the present invention is primarily directed.

SUMMARY OF THE INVENTION

In one embodiment, there is provided an ultra wideband, fast hopping frequency synthesizer that comprises of a signal generation unit, a first stage signal mixer unit, a first stage selector unit, a second stage signal mixer unit, and a second stage selector unit. The signal generation unit is adapted to generate a plurality of output signals and the first stage signal mixer unit receives a plurality of output signals from the signal unit and outputs a plurality of first mixed signals. The first stage selector unit receives a plurality of first mixed signals from the first stage signal mixer unit and a plurality of output signals from the signal generation unit and outputs a plurality of selected signals. The second stage signal mixer unit receives a plurality of output signals from the signal generation unit and a plurality of selected signals from the first stage selector unit and outputs a plurality of second mixed signals. The second stage selector unit receives the plurality of second mixed signals and outputs a plurality of ultra wideband signals.

In another embodiment, there is provided a method for generating fast hopping frequency signals. The method includes generating a reference signal at a signal generation unit, feeding the reference signal sequentially through a plurality of divider units, obtaining a first output signal from each divider unit, feeding a plurality of first output signals to a plurality of signal mixers, obtaining a plurality of second output signals from the plurality of signal mixers, receiving the plurality of second output signals at a selector unit, and selecting a second output signal from the selector unit.

Other objects, features, and advantages of the present invention will become apparent after review of the Brief Description of the Drawings, Detailed Description of the Invention, and the Claims.

DESCRIPTION OF THE INVENTION

According to the disadvantages observed above, the present invention teaches an improved frequency synthesizer architecture to alleviate the problems encountered for MB-OFDM UWB communication. This idea is preliminarily illustrated in FIG. 4. The main issue with the synthesizer is the required fast frequency switching. Without assistance of SSB mixers and selectors, a single PLL approach would require an unrealistically high reference frequency to meet the settling requirement. The use of a PLL for each frequency band and switching by selection is a costly approach and sensitive to inductor coupling and current leakage among all PLLs.

The major objective for industrial batch fabrication is to reduce the cost proportionally as less circuit active die area is consumed. Generally, in RF circuit designs, inductors occupy the most area, and a LC-VCO based PLL is usually chosen when high resonant frequency and lower phase noise are desired. Furthermore, in order to consume less space, a quadrature VCO (QVCO) being formed by two LC-VCOs is not considered to be adapted because of its large size. Consequently, the priority of minimizing the use and size of inductors leads to single PLL architecture. The goal is to fabricate a MB-OFDM UWB frequency synthesizer circuit with the least active area and the same performance in terms of phase noise, covered bands, power consumption, and switching time.

Figure 1:
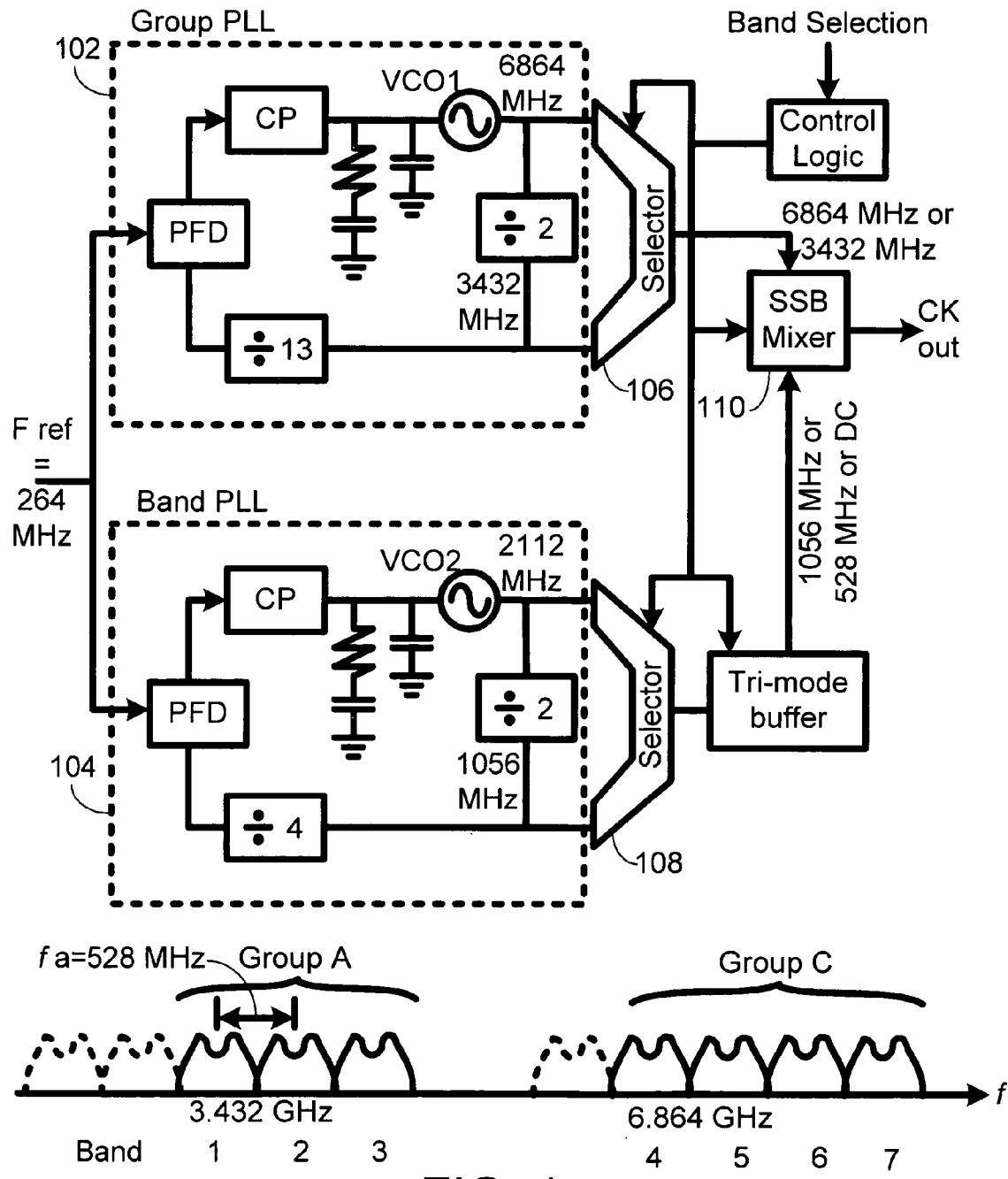
FIGS. 1-3 illustrate prior art architectures for different frequency synthesizers.
Figure 2:
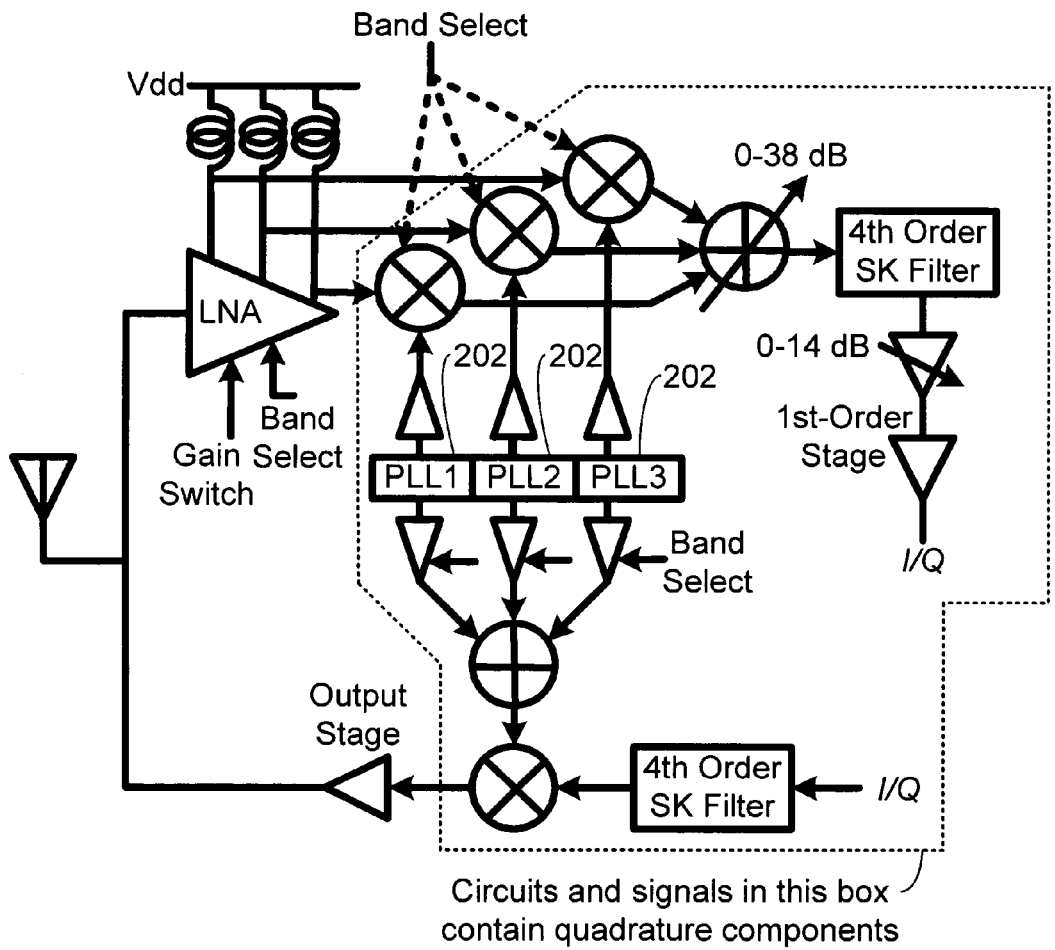
Figure 3:
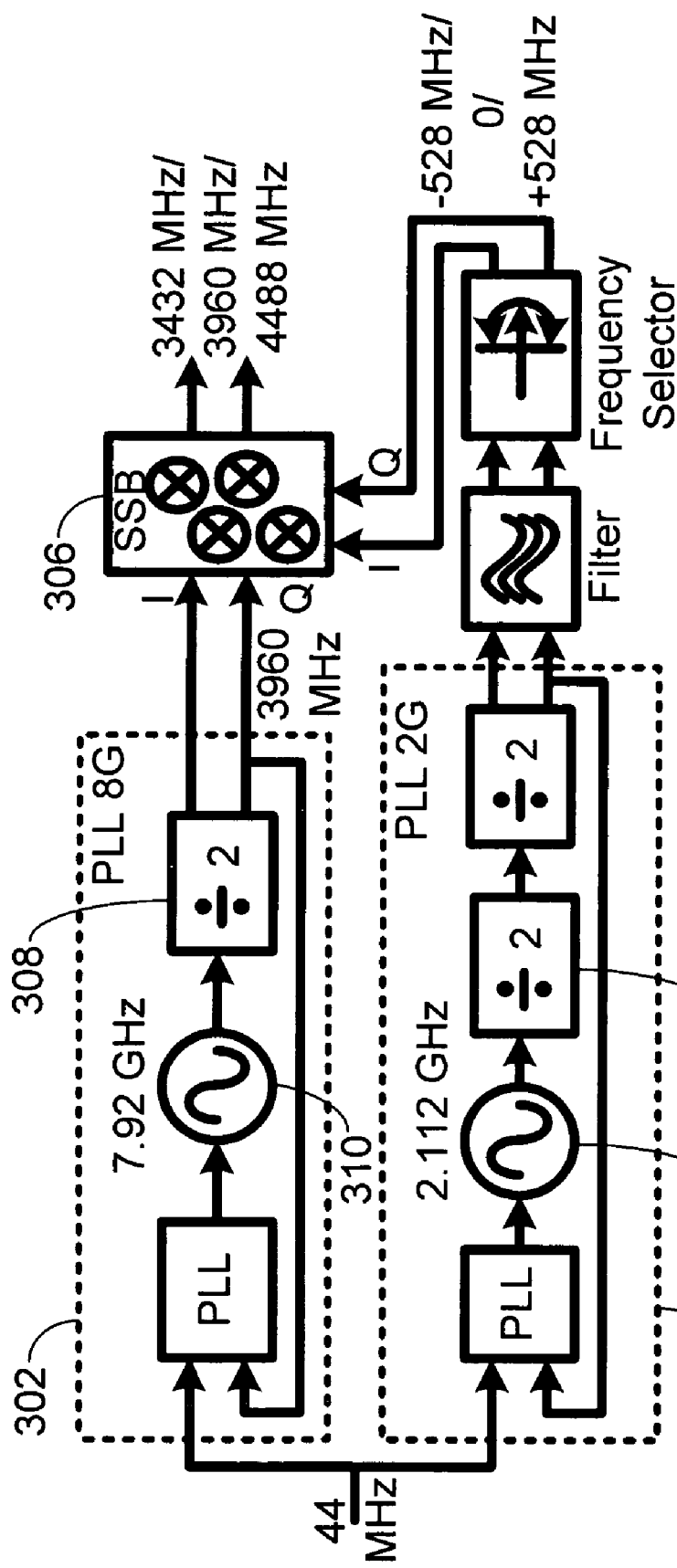
Figure 4:
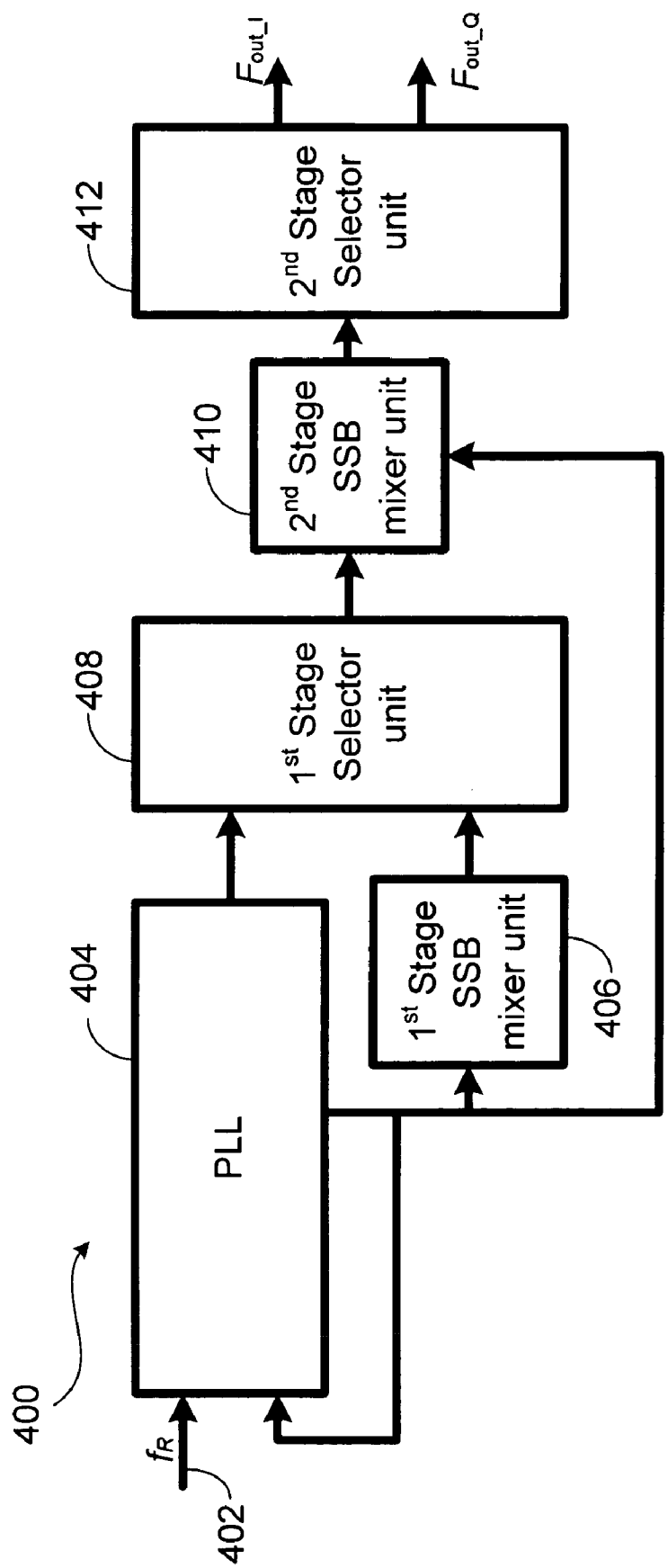
FIG. 4 illustrates architecture according to one embodiment of the invention.

The idea of a single PLL design is to take advantages of signals from outputs of multiple stages of divide-by-2 circuits, and these signals possess quadrature I/Q phases and can be fed into SSB mixers afterwards. After generation of these base frequencies, more SSB mixers can be used to compose a total of 6 bands of different frequencies required for Band group 1 and Band group 2. FIG. 4 illustrates architecture of one embodiment 400 employing a single PLL design according to the invention. A reference frequency 402 is fed to a signal generation unit 404, which is a single PLL. The signal generation unit 404 produces sub-frequency signals that are fed into a first stage SSB mixer unit 406 and a first stage selector unit 408. The first stage selector unit 408 also receives signals from the first stage SSB mixer unit 406. Some of the signal generation unit 404 output signals are fed back to the signal generation unit 404 itself, so the signal generation unit 404 output signals can be properly adjusted. The first stage selector unit 408 selects signals from either the signal generation unit 404 or the first stage SSB mixer unit 406 and outputs signals to a second stage SSB mixer unit 410, where these signals will be further mixed with the signals from the signal generation unit 404. The second stage SSB mixer unit 410 outputs two sets of signals to a second stage selector unit 412.

Figure 5:
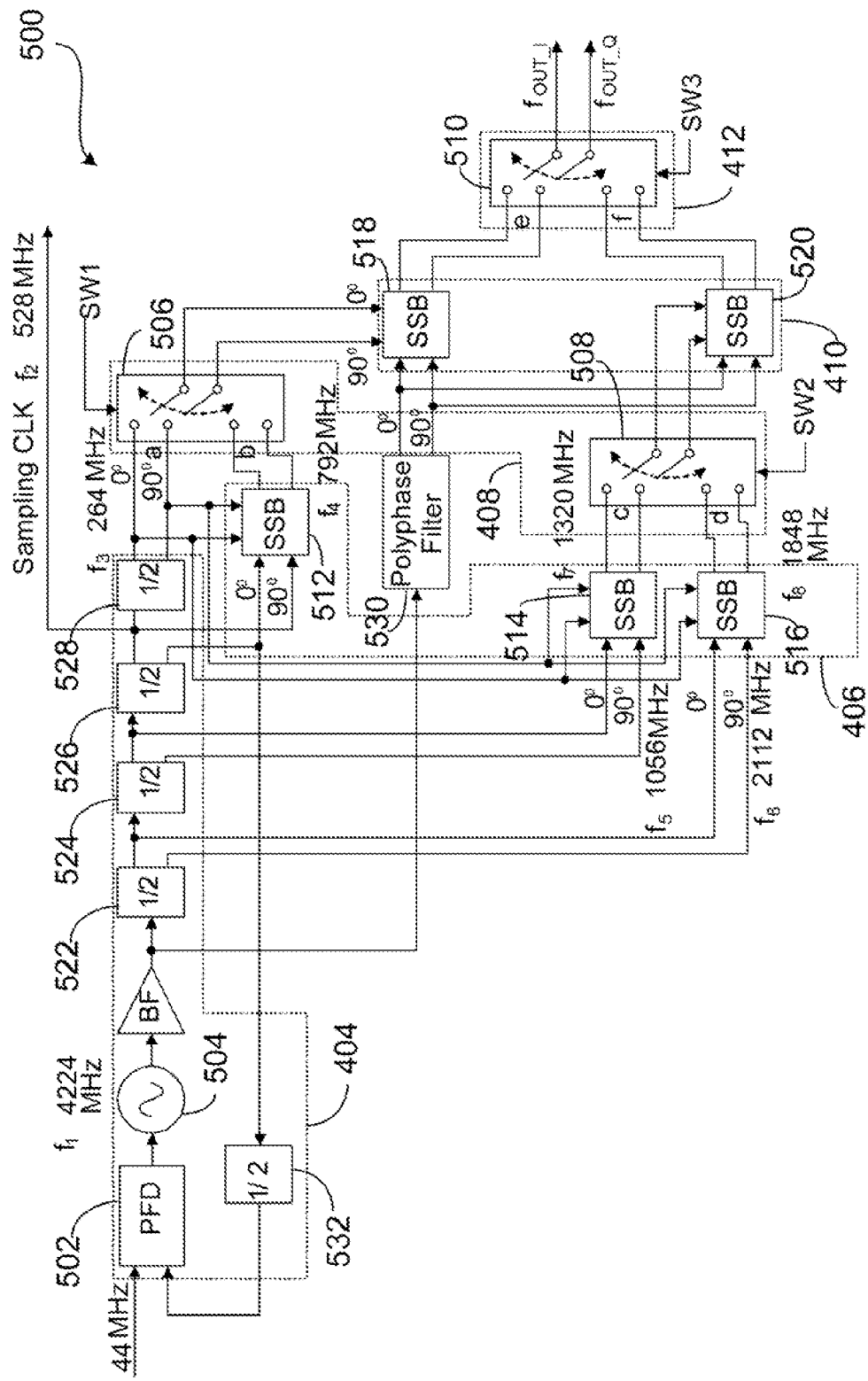
FIG. 5 illustrates a more detailed architecture of one embodiment of the invention.

FIG. 5 illustrates an implementation of the architecture shown in FIG. 4. The frequency synthesizer 500 of FIG. 5 comprises of single phase frequency detector (PFD) 502 with a LC-VCO 504 generating a signal with a frequency at 4224 MHz, three selectors 506, 508, 510, and five SSB mixers 512, 514, 516, 518, 520. This VCO 504 is followed by four separate divide-by-2 dividers 520, 522, 524, 526 whose function is to generate different seed signals at different frequencies, namely 2112, 1056, 528, 264 MHz. These seed signals (also known as reference signals) are mixed by three SSB mixers 512, 514, 516 of the first stage SSB mixer unit 406 to further generate signals with different frequencies, namely 792, 1320, 1848 MHz for selection. One of these seed signals is also fed through a feedback circuit to another divide-by-2 divider 532, the output of which is fed back to the PFD 502. The two selectors 506, 508 of the first stage selector unit 408 are in charged of selecting appropriate frequencies to feed into the SSB mixers 518, 520 in the second stage SSB mixer unit 410. The other input of the SSB mixers 518, 520 is from a polyphase filter 530 that generates I/Q signals by processing the output signal of the LC-VCO 504. Finally, two SSB mixers 518, 520 are responsible to synthesize the channel frequencies of Bank group 1 and 2 for local oscillators. The final selector 510 in the second stage selector unit 412 could decide which band frequency comes out.

Figure 6:
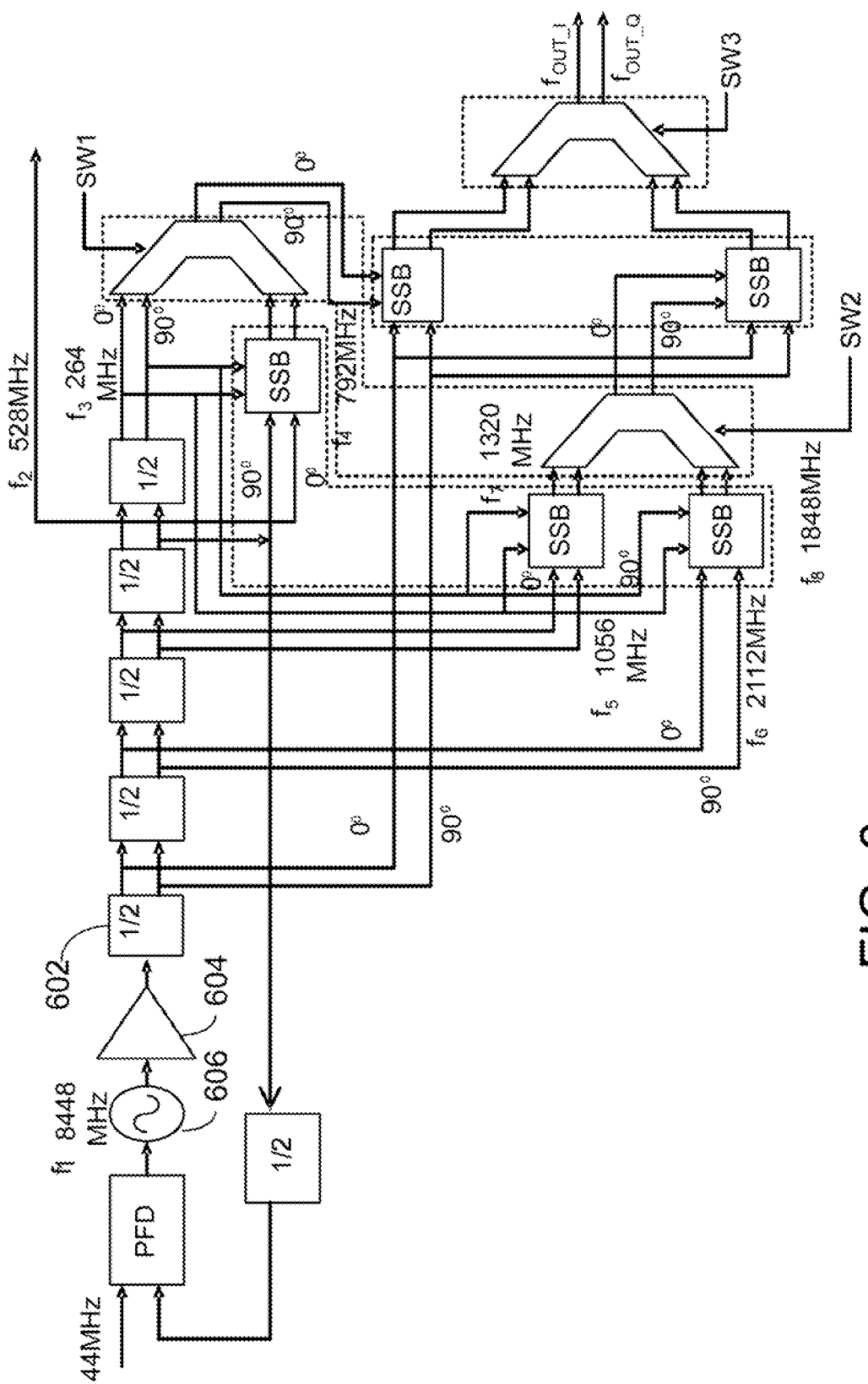
FIG. 6 illustrates another more detailed architecture of one embodiment of the invention.

The polyphase filter 530 of FIG. 5 is commonly implemented by a RC-CR method, which is subject to I/Q mismatch. An alternative embodiment is shown in FIG. 6, where one additional divide-by-2 circuit 602 is inserted right after VCO output buffer 604 to generate quadrature signals and replace the role of polyphase filter 530. Furthermore, this divider would force VCO 606 resonant frequency to be doubled up to 8448 MHz and lead to the use of smaller inductance, causing higher Q factor. A smaller inductance results into even less area consumed and less phase noise. FIG. 6 illustrates this advanced improvement of the single PLL design. The embodiment of FIG. 6 is similar to the embodiment of FIG. 5 except for the improvement described above, hence its description will not be repeated.

The present invention eliminates several shortcomings in use of SSB mixers. Generally, SSB mixing suffers from several drawbacks: (1) at least one signal fed to each submixer in an SSB mixer must contain a low harmonic distortion. (2) the port of each submixer that senses the low-distortion sinusoid must provide high linearity. (3) phase and gain mismatches at several gigahertz lead to many spurious components at the output of SSB mixers. The previous architecture requires accurate quadrature inputs and linear mixers, and needs more notice on the unwanted sidebands of target frequencies which are accumulated through multi-stage mixing, substantially degrading the output signal. The total power consumption has to keep low along with many of added SSB mixers and selectors.

In the architecture according to the invention, less active die area is used and thus the cost is minimized. Further, the invention also reduces inductor coupling. Aggressively taking advantages of dividers quadrature output signals not only moderates mismatch caused by a RC-CR polyphase filter but also benefits for the VCO with higher Q and less L. Moreover, this synthesizer could switch among 6 frequency bands continuously including Band group 1 and 2 while the switching time matches the Multi-Band OFDM proposal for IEEE 802.15 Task Group 3a of less than 9.5 ns.

While the invention has been particularly shown and described with reference to one embodiment thereof, it is understood by those skilled in the art that many modifications and other embodiments of the invention will come to mind to which the invention pertains, having the benefit of the teaching presented in the foregoing description and associated drawings. It is thus understood that the invention is not limited to the specific embodiments disclosed herein, and that many modifications and other embodiments of the inventions are intended to be included within the scope of the appended claims. Moreover, although specific terms are employed herein, as well as in the claims, they are used in a generic and descriptive sense only, and not for the purposes of limiting the described invention, nor the claims which follow below. Although elements of the invention may be described or claimed in the singular, the plural is contemplated unless limitation to the singular is explicitly stated.

What is claimed is:

1. A frequency synthesizer, comprising:
   a signal generation unit adapted to generate a plurality of output signals;
   a first stage signal mixer unit capable of receiving a plurality of output signals from the signal generation unit and outputting a plurality of first mixed signals;
   a first stage selector unit capable of receiving a plurality of first mixed signals from the first stage signal mixer unit and a plurality of output signals from the signal generation unit, the first stage selector unit outputting a plurality of selected signals;
   a second stage signal mixer unit capable of receiving a plurality of output signals from the signal generation unit and a plurality of selected signals from the first stage selector unit, and outputting a plurality of second mixed signals; and
   a second stage selector unit capable of receiving the plurality of second mixed signals and outputting a plurality of ultra wideband signals.

2. The frequency synthesizer of claim 1, wherein the signal generation unit further comprising:
   a phase frequency detecting circuit;
   a voltage controlled oscillator in communication with the phase frequency detecting circuit and capable of generating a reference signal; and
   a divider unit capable of receiving the reference signal and outputting a plurality of output signals with different frequencies.

3. The frequency synthesizer of claim 2, wherein the divider unit further comprising a plurality of divider circuits coupled sequentially.

4. The frequency synthesizer of claim 1, further comprising a feedback circuit capable of receiving at least one output signal from the signal generation unit and outputting a feedback signal to the signal generating unit.

5. The frequency synthesizer of claim 2, wherein the first stage signal mixer further comprising a plurality of single sideband mixers, each single sideband mixer capable of receiving a plurality of output signals from the divider unit.

6. The frequency synthesizer of claim 1, wherein the first stage selector unit further comprising a first selector circuit and a second selector circuit.

7. The frequency synthesizer of claim 6, wherein the second stage signal mixer further comprising:
   a first single sideband mixer capable of receiving a plurality of selected signals from the first selector circuit and a plurality of output signals from the divider unit; and
   a second single sideband mixer capable of receiving a plurality of selected signals from the second selector circuit and a plurality of output signals from the divider unit.

8. The frequency synthesizer of claim 7, wherein the second stage selector unit receives a plurality of output signals from the first single sideband mixer and a plurality of output signals from the second single sideband mixer.

9. A frequency synthesizer, comprising:
means for generating a plurality of output signals;
first signal mixing means for receiving a plurality of output signals from the means for generating the plurality of output signals and outputting a plurality of first mixed signals;
first signal selecting means for receiving a plurality of first mixed signals from the first signal mixing means and a plurality of output signals from the means for generating a plurality of output signals, the first signal selecting means being capable of outputting a plurality of selected signals;
second signal mixing means for receiving a plurality of output signals from the means for generating a plurality of output signals and a plurality of selected signals from the first signal selecting means, and the second signal mixing means being capable of outputting a plurality of second mixed signals; and
second signal selecting means for receiving the plurality of second mixed signals and outputting a plurality of ultra wideband signals.

10. The frequency synthesizer of claim 9, wherein the means for generating a plurality of output signals further comprising:
a phase frequency detecting circuit;
a voltage controlled oscillator in communication with the phase frequency detecting circuit and capable of generating a reference signal; and
a divider unit capable of receiving the reference signal and outputting a plurality of output signals with different frequencies.

11. The frequency synthesizer of claim 10, wherein the divider unit further comprising a plurality of divider circuits coupled sequentially.

12. The frequency synthesizer of claim 9, further comprising a feedback circuit capable of receiving at least one output signal from the means for generating a plurality of output signals and outputting a feedback signal to the means for generating a plurality of output signals.

13. The frequency synthesizer of claim 10, wherein the first signal mixing means further comprising a plurality of single sideband mixers, each single sideband mixer capable of receiving a plurality of output signals from the divider unit.

14. The frequency synthesizer of claim 10, wherein the first signal selecting means further comprising a first selector circuit and a second selector circuit.

15. The frequency synthesizer of claim 14, wherein the second signal mixing means further comprising:
a first single sideband mixer capable of receiving a plurality of selected signals from the first signal selecting means and a plurality of output signals from the divider unit; and
a second single sideband mixer capable of receiving a plurality of selected signals from the second signal selecting means and a plurality of output signals from the divider unit.

16. The frequency synthesizer of claim 15, wherein the second signal selecting means receives a plurality of output signals from the first single sideband mixer and a plurality of output signals from the second single sideband mixer.

17. A method of generating frequency signals in a ultra-wideband communication system, the method comprising the steps of:
preparing a first reference signal and a plurality of second reference signals, wherein each of the reference signals has a unique frequency;
mixing the plurality of second reference signals and outputting a plurality of first mixed signals;
selecting at least two signals from the second reference signals and the plurality of first mixed signals to define at least two selected signals;
separately mixing each of the at least two selected signals with the first reference signal to generate at least two second mixed signals; and
outputting one of the at least two second mixed signals as an output signal.

18. The method of claim 17, wherein the step of preparing comprises the steps of:
providing a phase locked loop to generate the first reference signal;
dividing the first reference signal sequentially by a dividing ratio to generate the plurality of second reference signals.

19. The method of claim 18, wherein the dividing ratio is 2.

20. The method of claim 17, wherein the step of selecting comprises operating at least two first selectors controlled by first selection information to output the at least two selected signals.

21. The method of claim 17, wherein the step of outputting comprises operating a second selector controlled by the second selection information to output the output signal.

22. The method of claim 17, wherein the step of mixing the plurality of reference signals comprises operating a plurality of frequency mixers, each mixer receiving two different sources and outputting one of the plurality of first mixed signals.

* * * * *